(12) United States Patent
Huang

(10) Patent No.: US 11,792,934 B2
(45) Date of Patent: Oct. 17, 2023

(54) PRINTED CIRCUIT BOARD AND DISPLAY CONNECTION STRUCTURE

(71) Applicants: CHONGQING ADVANCE DISPLAY TECHNOLOGY RESEARCH, Chongqing (CN); CHONGQING HKC OPTOELECTRONICS TECHNOLOGY CO., LTD, Chongqing (CN)

(72) Inventor: Xiaoyu Huang, Chongqing (CN)

(73) Assignees: CHONGQING ADVANCE DISPLAY TECHNOLOGY RESEARCH, Chongqing (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 485 days.

(21) Appl. No.: 17/272,655

(22) PCT Filed: May 24, 2019

(86) PCT No.: PCT/CN2019/088367
§ 371 (c)(1),
(2) Date: Mar. 2, 2021

(87) PCT Pub. No.: WO2020/093683
PCT Pub. Date: May 14, 2020

(65) Prior Publication Data
US 2021/0345488 A1   Nov. 4, 2021

(30) Foreign Application Priority Data

Nov. 9, 2018 (CN) .......................... 201821843574.5

(51) Int. Cl.
H05K 1/11 (2006.01)
H05K 1/18 (2006.01)
G02F 1/1362 (2006.01)

(52) U.S. Cl.
CPC ....... *H05K 1/181* (2013.01); *G02F 1/136286* (2013.01); *H05K 2201/0738* (2013.01);
(Continued)

(58) Field of Classification Search
CPC ......... H05K 1/111; H05K 2201/09409; H05K 2201/0738; H05K 2201/10174; H05K 1/0259; H05K 2201/10053
See application file for complete search history.

(56) References Cited

U.S. PATENT DOCUMENTS

2016/0104692 A1  4/2016  Lee et al.
2019/0148408 A1* 5/2019  Song .................. H01L 27/1262
                                                                257/72

FOREIGN PATENT DOCUMENTS

| CN | 102749743 A | 10/2012 |
| CN | 107463033 A | 12/2017 |
| CN | 208609260 U | 3/2019 |

OTHER PUBLICATIONS

Hui Zhao, the ISA written comments, Jul. 2019, CN.
Hui Zhao, the International Search Report, dated Jul. 2019, CN.

* cited by examiner

*Primary Examiner* — Sherman Ng

(57) ABSTRACT

This application relates to a printed circuit board, including: a plurality of bonding pad areas configured to be electrically connected to a display; a plurality of dummy pad areas located in the plurality of bonding pad areas and configured to be connected to the ground; and a contact pad area existing between the plurality of dummy pad areas and electrically connected to the bonding pad area. The contact (Continued)

pad area includes a plurality of contact pads configured to be electrically connected to an external input connector. A width of the plurality of contact pads is 0.3 mm, and a distance between the plurality of contact pads is 0.2 mm. A length of the contact pad is the same as a length of a bonding pad in the bonding pad area.

20 Claims, 3 Drawing Sheets

(52) U.S. Cl.
CPC .............. *H05K 2201/09409* (2013.01); *H05K 2201/10136* (2013.01); *H05K 2201/10174* (2013.01)

US 11,792,934 B2

PRINTED CIRCUIT BOARD AND DISPLAY CONNECTION STRUCTURE

This application claims the priority to the Chinese Patent Application No. 201821843574.5, filed with National Intellectual Property Administration, PRC on Nov. 9, 2018 and entitled "PRINTED CIRCUIT BOARD AND DISPLAY CONNECTION STRUCTURE", which is incorporated herein by reference in its entirety.

TECHNICAL FIELD

This application relates to a printed circuit board, and in particular, to a connection structure between a printed circuit board and a display.

BACKGROUND

The statement herein only provides background information related to this application, and does not necessarily constitute the prior art.

A thin film transistor liquid crystal display (TFT-LCD) is one of the main types of current flat panel displays, which has become an important display platform in video products in the modern information technology industry (IT industry). In order to implement narrow bezel design, and in response to a trend of an electronic product of becoming lighter, thinner, shorter, with better function, and developing faster, the technology of driving chip packaging is also developing toward the trend of a thinner thickness and a smaller area. Both a gate chip and a source chip are packaged by using a chip-on film (COF).

In the current printed circuit board (PCB) design, the fanout design is mainly completed by PCB engineers manually, so that even for the same package device, the PCB design engineers also need to complete the corresponding fanout design manually one by one. Moreover, for the fanout design form designed by a PCB design engineer, when the engineer designs another PCB, that is, even if the original fanout design can meet the requirement, the PCB also needs to be redesigned. Therefore, without a fanout design sharing mechanism, the fanout design efficiency in the PCB design is relatively low, resulting in great reduction of the efficiency of the whole PCB design.

SUMMARY

In order to resolve the above problem, this application is intended to provide a printed circuit board (PCB), and in particular, to a connection structure between a printed circuit board and a display, so that a gold finger area on the existing PCB is combined with a contact pad. This method can avoid the disadvantage that a contact pad area needs to be additionally and separately arranged in the related art, thereby saving the area of the PCB, further reducing product costs.

This application further includes the arrangement of diodes and switches (MOS), which can prevent the Electro-Static discharge (ESD) in the fanout area from damaging an assembly on the printed circuit board (PCB), to improve the product yield.

The purpose of this application and the solving of technical defects are implemented by adopting the following technical solutions. A printed circuit board (PCB) proposed according to this application includes: a plurality of bonding pad areas configured to be electrically connected to a display; a plurality of dummy pad areas located in the plurality of bonding pad areas and configured to be connected to the ground; and a contact pad area existing between the plurality of dummy pad areas and electrically connected to the bonding pad area.

Another purpose of this application is to provide a display connection structure, including: a display area including a fanout area; a printed circuit board (PCB) configured to be electrically connected to the fanout area and including: a plurality of bonding pad areas configured to be electrically connected to the fanout area; a plurality of dummy pad areas located in the plurality of bonding pad areas and configured to be connected to the ground; and a contact pad area existing between the plurality of dummy pad areas and electrically connected to the bonding pad area.

The purpose of this application and the solving of technical defects may further be implemented by adopting the following technical measures.

In one or more embodiments of this application, the contact pad area includes a plurality of contact pads configured to be electrically connected to an external input connector, a width of the plurality of contact pads being 0.3 mm.

In one or more embodiments of this application, the contact pad area includes a plurality of contact pads configured to be electrically connected to an external input connector, a distance between the plurality of contact pads being 0.2 mm.

In one or more embodiments of this application, the contact pad area includes a plurality of contact pads, a length of the contact pad being the same as a length of a bonding pad in the bonding pad area.

In one or more embodiments of this application, the fanout area includes a turn-on voltage and a turn-off voltage electrically connected to a first switch and a second switch, to control turn-on or turn-off of the first switch and the second switch, and the first switch and the second switch are electrically connected to the bonding pad area of the PCB.

In one or more embodiments of this application, in the fanout area, a resistance exists between the turn-on voltage and the turn-off voltage, the resistance being greater than 100 KΩ.

In one or more embodiments of this application, the fanout area includes a first Schottky diode electrically connected between the first switch and the ground and a second Schottky diode electrically connected between the second switch and the ground.

According to this application, the disadvantage that a contact pad area needs to be additionally and separately arranged in the related art can be avoided, thereby saving the area of the PCB, further reducing product costs. Electro-Static discharge (ESD) in the fanout area can be prevented from damaging an assembly on the PCB, to improve the product yield.

DETAILED DESCRIPTION OF EMBODIMENTS

Figure 1:
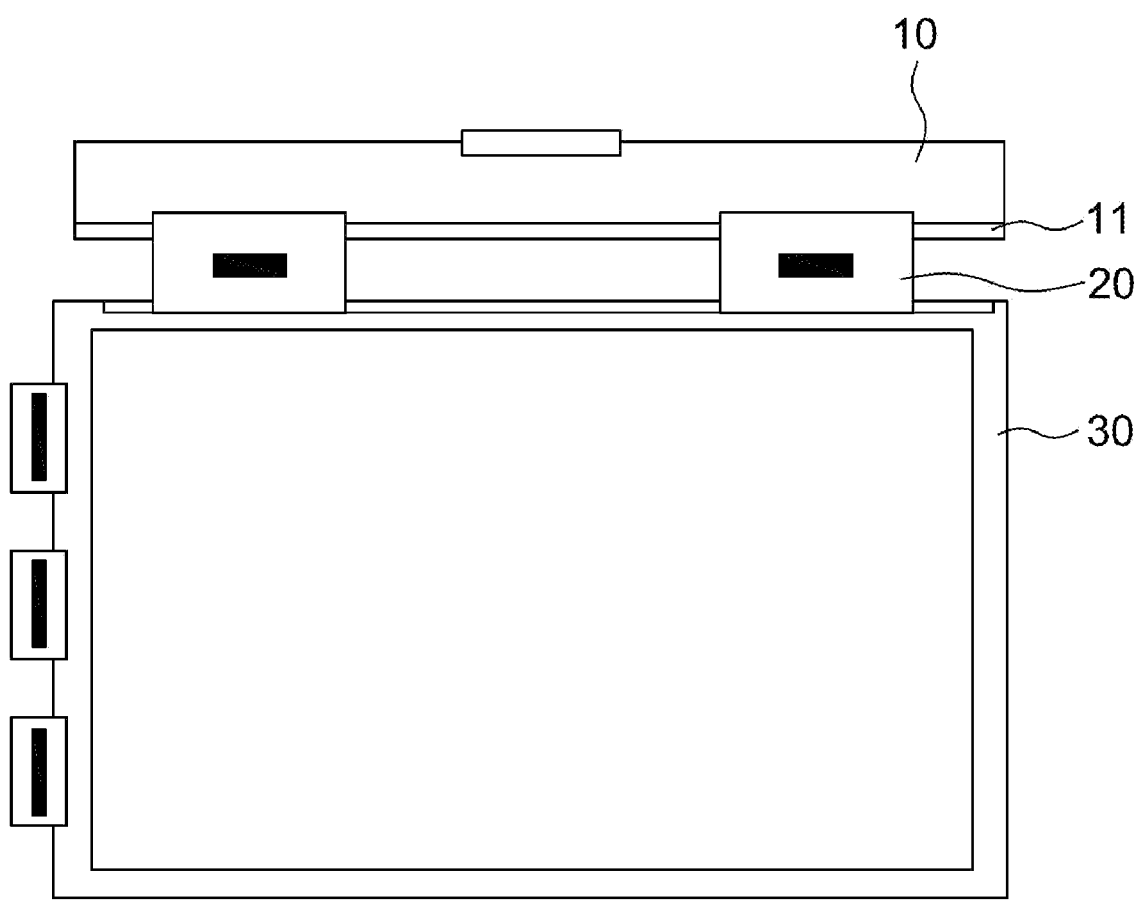
FIG. 1 is a schematic diagram of a display and printed circuit board (PCB) according to an example.

The following embodiments are described with reference to the accompanying drawings, and are used to exemplify particular embodiments that this application can be used to implement. The directional terms mentioned in this application, for example, "upper", "lower", "before", "after", "left", "right", "inside", "outside", and "side", are only references to the directions in the drawings. Therefore, the used direction terms are intended to describe and understand this application, but are not intended to limit this application.

The drawings and description are considered to be illustrative in nature rather than restrictive. In the figures, structurally similar units are denoted by the same reference numerals. In addition, for understanding and ease of description, the size and thickness of each component in the drawings are arbitrarily shown, but this application is not limited to this.

In the accompanying drawings, the thicknesses of layers, films, panels, regions, and the like are enlarged for clarity. In the accompanying drawings, the thicknesses of some layers and regions are enlarged for understanding and ease of description. It is to be understood that, when a component such as a layer, film, region or substrate is referred to as being "on" another component, the component may be directly on the another component, or an intermediate component may exist.

In addition, in this specification, unless explicitly described to the contrary, the word "including" will be understood to mean including the component but not excluding any other component. Besides, in this specification, "on" means that it is above or below the target component and does not mean that it is necessary to be on top based on the direction of gravity.

In order to further illustrate the technical means used to achieve the intended purpose of this application and the technical effects thereof, specific implementations, structures, features of a method for controlling curvature of an adjustable curved display proposed in this application and the effects thereof are described below in detail in conjunction with the accompanying drawings and the optional embodiments.

Figure 2:
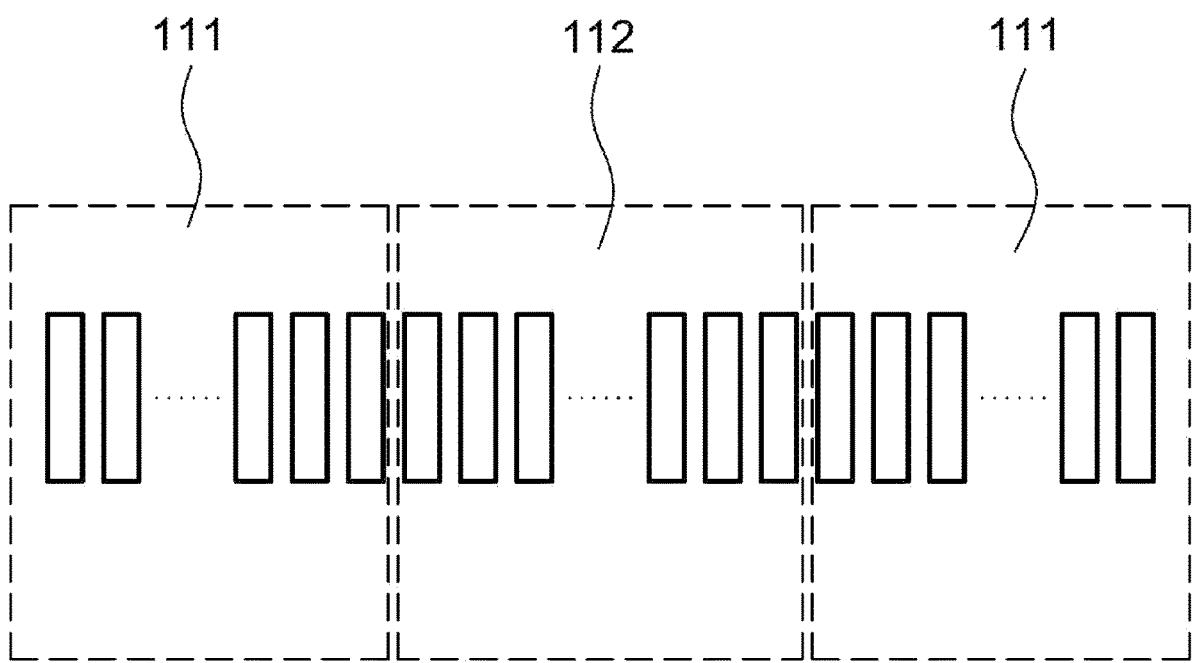
FIG. 2 is a schematic diagram of a gold finger of a printed circuit board (PCB) according to an example.

Referring to FIG. 1 to FIG. 2, the main driving principle of a thin film transistor liquid crystal display (TFT-LCD) is that a system motherboard connects an R/G/B compression signal, a control signal, and a power signal to a connector on a printed circuit board (PCB) through a wire, and after data is processed by a timing controller (TCON) IC on the PCB 10, the display is connected to a display area by using a source-chip on film (S-COF) 20 and a gate-chip on film (G-COF) through the PCB, so that the LCD obtains the required power and signals.

In order to avoid damage to a connector caused by manual plugging and unplugging in daily use, and to improve the production automation and efficiency of the factory, an automatic connection (Auto Contact) system is introduced into the factory production line, to directly input, to a test point on the PCB through a metal probe, the R/G/B compression signal, the control signal, and the power signal that are originally input to the PCB through the connector.

In the related art, the PCB 10 is connected to the S-COF 20 through a bonding pad in the bonding pad area on the gold finger area 11 on the PCB 10, and the gold finger area is composed of a bonding pad area 111 and a dummy pad area 112. An area connected between the S-COF and the PCB is the bonding pad area 111, and a gold finger of the dummy pad area 112 only has a function of grounding.

However, in the above, the PCB structure requires a contact pad area arranged additionally and separately, which occupies a large area, and the Electro-Static discharge (ESD) in the fanout area in the existing structure easily causes damage to an assembly on the PCB.

Figure 3:
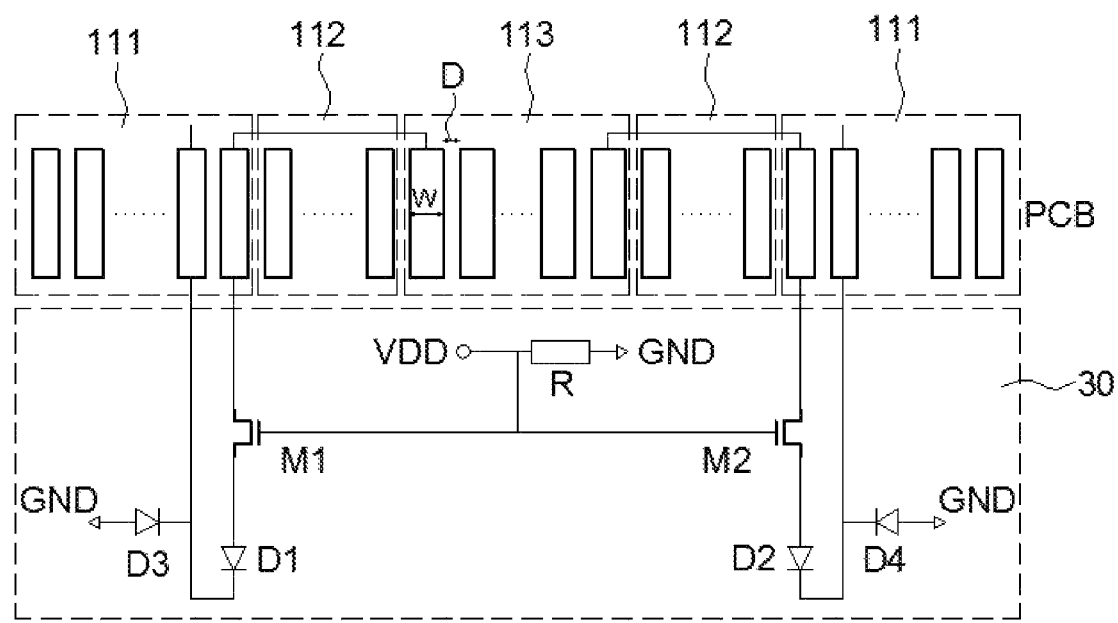
FIG. 3 is a schematic diagram of a display connection structure according to an embodiment of this application.

Referring to FIG. 3, FIG. 3 is a schematic diagram of a display connection structure according to an embodiment of this application. The display connection structure includes a printed circuit board (PCB) having a gold finger area 11. The gold finger area 11 includes: a plurality of bonding pad areas 111 configured to be electrically connected to a fanout area 30; a plurality of dummy pad areas 112 located in the plurality of bonding pad areas 111 and configured to be connected to the ground; and a contact pad area 113 existing between the plurality of dummy pad areas 112 and electrically connected to the bonding pad area 111.

In one or more embodiments of this application, the contact pad area 113 includes a plurality of contact pads 1131 configured to be electrically connected to an external input connector (not shown). A width W of the plurality of contact pads 1131 is 0.3 mm.

In one or more embodiments of this application, the contact pad area 113 includes a plurality of contact pads 1131 configured to be electrically connected to an external input connector. A distance D between the plurality of contact pads 1131 is 0.2 mm.

In one or more embodiments of this application, the contact pad area 113 includes a plurality of contact pads 1131. A length of the contact pad 1131 is the same as a length of a bonding pad 1111 in the bonding pad area 111, and may be the same as a length of a dummy pad 1121 in the dummy pad area 112.

As described above, this application provides a display connection structure, including: a display area including a fanout area 30; a printed circuit board (PCB) having a gold finger area 11 including: a plurality of bonding pad areas 111 configured to be electrically connected to the fanout area 30; a plurality of dummy pad areas 112 located in the plurality of bonding pad areas 111 and configured to be connected to the ground; and a contact pad area 113 existing between the plurality of dummy pad areas 112 and electrically connected to the bonding pad area 111.

In one or more embodiments of this application, the contact pad area 113 includes a plurality of contact pads 1131 configured to be electrically connected to an external input connector (not shown). A width W of the plurality of contact pads 1131 is 0.3 mm.

In one or more embodiments of this application, the contact pad area 113 includes a plurality of contact pads 1131 configured to be electrically connected to an external input connector. A distance D between the plurality of contact pads 1131 is 0.2 mm.

In one or more embodiments of this application, the contact pad area 113 includes a plurality of contact pads 1131. A length of the contact pad 1131 is the same as a length of a bonding pad 1111 in the bonding pad area 111, and may be the same as a length of a dummy pad 1121 in the dummy pad area 112.

In one or more embodiments of this application, the fanout area 30 includes a turn-on voltage VDD and a turn-off voltage GND electrically connected to a first switch M1 and a second switch M2, to control turn-on or turn-off of the first switch M1 and the second switch M2. The first switch M1 and the second switch M2 are metal-oxide-semiconductor field-effect (MOS) diode switches. The first switch M1 and the second switch M2 are electrically connected to the bonding pad area 111 of the PCB 10. Specifically, the first switch M1 and the second switch M2 are electrically connected to the bonding pad 1111 of the bonding pad area 111 of the gold finger area 11 of the PCB.

It may be learned from the above that the contact pad area 113 is electrically connected to the bonding pad area 111 through wiring of the PCB, is electrically connected to the fanout area 30 through a source-chip on film (S-COF), and is connected, after passing through the first switch M1, a first diode D1 or the second switch M2, and a second diode D2, to the PCB through the S-COF.

In one or more embodiments of this application, in the fanout area 30, a resistance R exists between the turn-on voltage VDD and the turn-off voltage GND. The resistance R is greater than 100 KΩ.

In one or more embodiments of this application, the fanout area 30 includes a first Schottky diode D3 electrically connected between the first switch M1 and the ground GND and a second Schottky diode D4 electrically connected between the second switch M2 and the ground GND. When there is Electro-Static discharge outside, the first Schottky diode D3 and the second Schottky diode D4 are capable of absorbing the Electro-Static discharge (ESD).

In actual application, an Auto Contact machine directly inputs, to the contact pad 1131 of the contact pad area 113 by using a metal probe, the R/G/B compression signal, the control signal, and the power signal that are originally input to the PCB through the external connector. The power signal is directly connected to the PCB through the contact pad 1131 to generate voltages such as a VDD. However, the R/G/B compression signal and the control signal have weak antistatic (ESD) ability due to being directly connected to a control IC. Therefore, such signals are first transmitted to the fanout area through the metal-oxide-semiconductor field-effect (MOS) diode switch and a diode, and then transmitted to the PCB after passing through static (ESD) protection devices such as the first Schottky diode D3 and the second Schottky diode D4.

Based on the above, the disadvantage that a contact pad area needs to be additionally and separately arranged in the related art is avoided, and the area of the PCB is saved, thereby reducing product costs. In addition, Electro-Static discharge (ESD) in the fanout area can be prevented from damaging components and parts on the PCB, to improve the product yield.

The terms such as "in some embodiments" and "in various embodiments" are repeatedly used. The terms used usually do not refer to the same embodiment, but the terms can also refer to the same embodiment. Words such as "contain", "have" and "include" are synonyms, unless the context shows other meanings.

The above descriptions are merely optional embodiments of this application, and are not intended to restrict the application in any form. Although this application is described above with reference to the optional embodiments, the embodiments are not intended to limit this application. A person skilled in the art may make some equivalent variations, alterations or modifications to the above-disclosed technical content without departing from the scope of the technical solutions of this application to obtain equivalent embodiments. However, any simple modification, equivalent change and modification made to the above embodiments according to the technical essence of the application without departing from the content of the technical solutions of this application shall fall within the scope of the technical solutions of this application.

What is claimed is:

1. A printed circuit board, comprising:
   a plurality of bonding pad areas configured to be electrically connected to a display;
   a plurality of dummy pad areas located in the plurality of bonding pad areas and configured to be connected to the ground; and
   a contact pad area existing between the plurality of dummy pad areas and electrically connected to the bonding pad area.

2. The printed circuit board according to claim 1, wherein the contact pad area comprises a plurality of contact pads configured to be electrically connected to an external input connector, a width of the plurality of contact pads being 0.3 mm.

3. The printed circuit board according to claim 1, wherein the contact pad area comprises a plurality of contact pads configured to be electrically connected to an external input connector, a distance between the plurality of contact pads being 0.2 mm.

4. The printed circuit board according to claim 1, wherein the contact pad area comprises a plurality of contact pads, a length of the contact pad being the same as a length of a bonding pad in the bonding pad area.

5. The printed circuit board according to claim 1, further comprising a gold finger area.

6. A display connection structure, comprising:
   a display area comprising a fanout area;
   a printed circuit board (PCB) configured to be electrically connected to the fanout area and comprising:
     a plurality of bonding pad areas configured to be electrically connected to the fanout area; and
     a plurality of dummy pad areas located in the plurality of bonding pad areas and configured to be connected to the ground; and
     a contact pad area existing between the plurality of dummy pad areas and electrically connected to the bonding pad area.

7. The display connection structure according to claim 6, wherein the contact pad area comprises a plurality of contact pads configured to be electrically connected to an external input connector, a width of the plurality of contact pads being 0.3 mm.

8. The display connection structure according to claim 6, wherein the contact pad area comprises a plurality of contact pads configured to be electrically connected to an external input connector, a distance between the plurality of contact pads being 0.2 mm.

9. The display connection structure according to claim 6, wherein the contact pad area comprises a plurality of contact pads, a length of the contact pad being the same as a length of a bonding pad in the bonding pad area.

10. The display connection structure according to claim 6, wherein the fanout area comprises a turn-on voltage and a turn-off voltage electrically connected to a first switch and a second switch, to control turn-on or turn-off of the first switch and the second switch.

11. The display connection structure according to claim 6, wherein a first switch and a second switch are electrically connected to the bonding pad area of the PCB.

12. The display connection structure according to claim 10, wherein in the fanout area, a resistance exists between the turn-on voltage and the turn-off voltage, the resistance being greater than 100 KΩ.

13. The display connection structure according to claim 6, wherein the fanout area comprises a first Schottky diode electrically connected between a first switch and the ground and a second Schottky diode electrically connected between a second switch and the ground.

14. The display connection structure according to claim 6, wherein a first switch and a second switch are metal-oxide-semiconductor field-effect diode switches.

15. The display connection structure according to claim 13, wherein when there is Electro-Static discharge outside, the first Schottky diode and the second Schottky diode are capable of absorbing the Electro-Static discharge.

16. A display connection structure, comprising:
a display area comprising a fanout area;
a printed circuit board (PCB) configured to be electrically connected to the fanout area and comprising:
   a plurality of bonding pad areas configured to be electrically connected to the fanout area; and
   a plurality of dummy pad areas located in the plurality of bonding pad areas and configured to be connected to the ground; and
   a contact pad area existing between the plurality of dummy pad areas and electrically connected to the bonding pad area, wherein
the fanout area comprises a turn-on voltage and a turn-off voltage electrically connected to a first switch and a second switch, to control turn-on or turn-off of the first switch and the second switch;
the first switch and the second switch are electrically connected to the bonding pad area of the PCB, and a resistance exists between the turn-on voltage and the turn-off voltage, the resistance being greater than 100 KΩ; and
the fanout area comprises a first Schottky diode electrically connected between the first switch and the ground and a second Schottky diode electrically connected between the second switch and the ground.

17. The display connection structure according to claim 16, wherein the contact pad area comprises a plurality of contact pads configured to be electrically connected to an external input connector, a width of the plurality of contact pads being 0.3 mm.

18. The display connection structure according to claim 16, wherein the contact pad area comprises a plurality of contact pads configured to be electrically connected to an external input connector, a distance between the plurality of contact pads being 0.2 mm.

19. The display connection structure according to claim 16, wherein the PCB has a gold finger area.

20. The display connection structure according to claim 19, wherein the gold finger area comprises: the plurality of bonding pad areas and the plurality of dummy pad areas.

* * * * *